United States Patent
Han et al.

(10) Patent No.: US 9,716,114 B2
(45) Date of Patent: Jul. 25, 2017

(54) ARRAY SUBSTRATE WITH HIGH QUALIFIED RATE AND MANUFACTURING METHOD THEREOF

(71) Applicant: SHENZHEN CHINA STAR OPTOELECTRONICS TECHNOLOGY CO., LTD., Guangdong (CN)

(72) Inventors: Bing Han, Shenzhen (CN); Zuomin Liao, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,766

(22) PCT Filed: Dec. 19, 2014

(86) PCT No.: PCT/CN2014/094403
§ 371 (c)(1),
(2) Date: Apr. 27, 2016

(87) PCT Pub. No.: WO2016/078179
PCT Pub. Date: May 26, 2016

(65) Prior Publication Data
US 2016/0358946 A1 Dec. 8, 2016

(30) Foreign Application Priority Data

Nov. 17, 2014 (CN) .......................... 2014 1 0655483

(51) Int. Cl.
*H01L 27/14* (2006.01)
*H01L 29/04* (2006.01)
(Continued)

(52) U.S. Cl.
CPC ........ *H01L 27/1244* (2013.01); *G02F 1/1362* (2013.01); *H01L 27/0248* (2013.01); *H01L 27/1262* (2013.01)

(58) Field of Classification Search
CPC ............. H01L 27/1244; H01L 27/1262; H01L 27/0248; G02F 1/1362
See application file for complete search history.

(56) References Cited

U.S. PATENT DOCUMENTS

2009/0322977 A1 12/2009 Chung et al.
2010/0177270 A1 7/2010 Nakagawa
2015/0364494 A1 12/2015 Cheng et al.

FOREIGN PATENT DOCUMENTS

CN 101201520 A 6/2008
CN 101299124 A 11/2008
(Continued)

*Primary Examiner* — Stephen W Smoot
*Assistant Examiner* — Vicki B Booker
(74) *Attorney, Agent, or Firm* — Buchanan Ingersoll & Rooney PC (57) ABSTRACT

An array substrate and a manufacturing method thereof are disclosed. The present disclosure relates to the technical field of display, whereby the qualified rate of the array substrate can be improved, and the manufacturing cost thereof can be reduced significantly. The array substrate includes a first wiring, a first insulating layer, and a second wiring from bottom up in sequence. The second wiring crosses over the first wiring. A crossed-over part of the second wiring consists of a plurality of branches, with an interspace formed between every two adjacent branches, so as to obtain a comb structure. At least one of the branches is nearer to the first wiring relative to other branches. The array substrate of the present disclosure can be used in liquid crystal TV, liquid crystal display, mobile phone, tablet personal computer, and other display devices.

7 Claims, 5 Drawing Sheets

(51) Int. Cl.
*H01L 29/15* (2006.01)
*H01L 31/036* (2006.01)
*H01L 27/12* (2006.01)
*G02F 1/1362* (2006.01)
*H01L 27/02* (2006.01)

(56) References Cited

FOREIGN PATENT DOCUMENTS

| | | |
|---|---|---|
| CN | 101681569 A | 3/2010 |
| CN | 203870366 U | 10/2014 |
| JP | 2004347891 A | 12/2014 |

ARRAY SUBSTRATE WITH HIGH QUALIFIED RATE AND MANUFACTURING METHOD THEREOF

CROSS REFERENCE TO RELATED APPLICATION

The present application claims benefit of Chinese patent application CN 201410655483.9, entitled "Array Substrate and Manufacturing Method Thereof" and filed on Nov. 17, 2014, which is incorporated herein by reference.

FIELD OF THE INVENTION

The present disclosure relates to the technical field of display, and particularly to an array substrate and a manufacturing method thereof.

BACKGROUND OF THE INVENTION

The array substrate comprises a plurality of wirings. Due to restricted area of the array substrate, different wirings carrying different signals are located in different horizontal planes of the substrate, generally in a staggered manner. In order to guarantee insulation between two wirings which are arranged in a staggered manner, a first insulating layer is provided therebetween. It is discovered that, however, during the manufacturing process of the array substrate, electrostatic charges would accumulate in the first wiring and the second wiring. When the electrostatic charges accumulate to a certain extent, Electro-Static Discharge (ESD) would occur at a crossed-over part of the two wirings. Since the temperature of the place where ESD occurs is rather high, the two wirings would connect with each other, resulting in short circuit phenomenon. Consequently, the array substrate would be destroyed.

Figure 1:
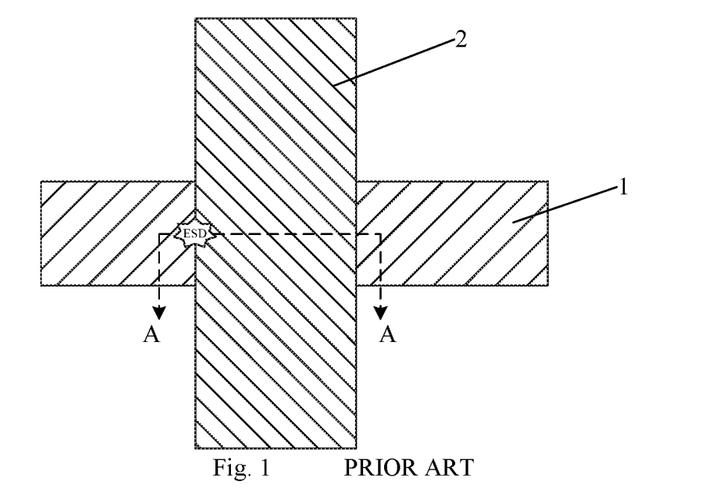
FIG. 1 is a plan view showing that ESD occurs to the first wiring and the second wiring of an array substrate in the prior art.
Figure 2:
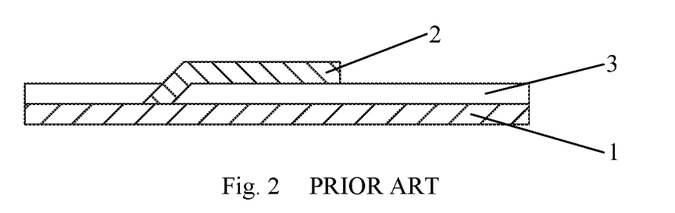
FIG. 2 is a sectional view of FIG. 1 along A-A direction.

Specifically, as shown in FIG. 1 and FIG. 2, in order to facilitate the understanding, a wiring located below a first insulating layer 3 is defined as a first wiring 1, and a wiring located above the first insulating layer 3 is defined as a second wiring 2. Since the temperature of the place where ESD occurs is rather high, the second wiring 2 and a portion of the first insulating layer 3, which is located between the second wiring 2 and the first wiring 1, would be melted. In this case, the second wiring 2 would drop partially to touch the first wiring 1, which would lead to short circuit phenomenon. Under such circumstances, the whole array substrate would be destroyed. Therefore, the manufacturing difficulty and manufacturing cost of the array substrate are relatively high.

Figure 3:
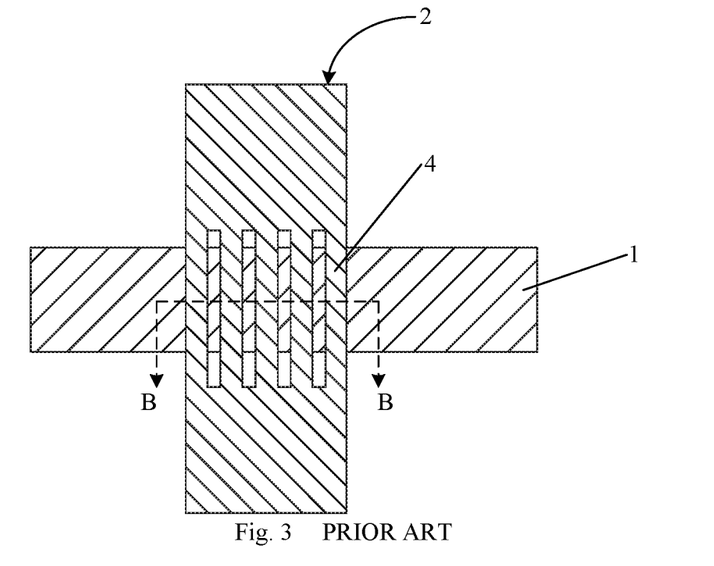
FIG. 3 is a plan view of the first wiring and the second wiring of a modified array substrate in the prior art.
Figure 4:
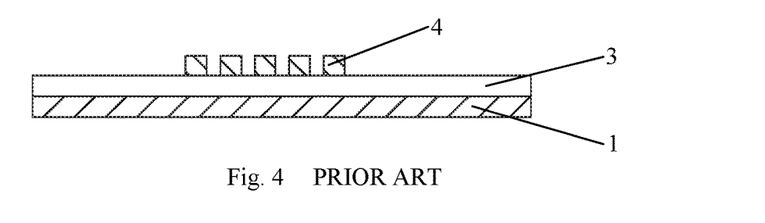
FIG. 4 is a sectional view of FIG. 3 along B-B direction.
Figure 5:
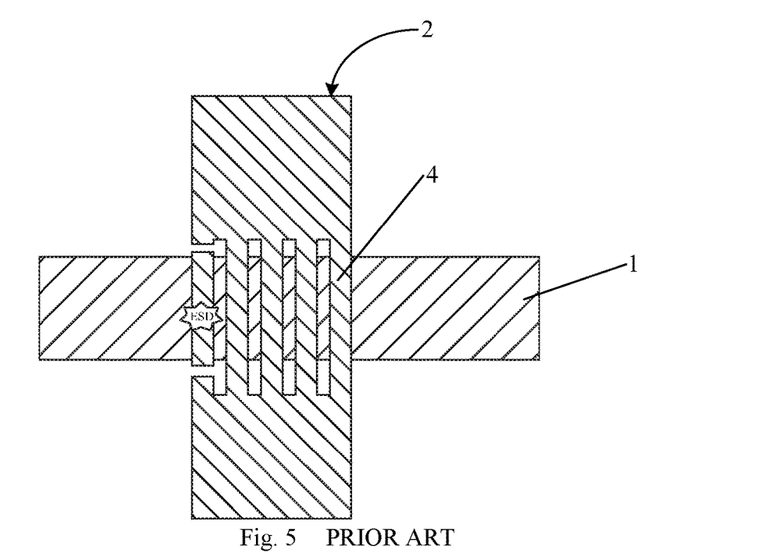
FIG. 5 schematically shows the repaired wirings after ESD occurs to one of the branches as shown in FIG. 3.

The ESD phenomenon cannot be prevented and avoided in the prior art. In order to guarantee that the wiring suffering the ESD phenomenon can be used as usual, and thus the array substrate can be further manufactured even if the ESD phenomenon occurs, the following measure can be taken. Specifically, as shown in FIG. 3 and FIG. 4, the crossed-over part of the second wiring 2, i.e., the place where the second wiring 2 crosses over the first wiring 1, is generally separated into a plurality of branches 4, with an interspace formed between every two adjacent branches 4. As shown in FIG. 5, when the ESD phenomenon occurs to one of the branches 4, the two ends of said branch 4 can be cut off, and the performances of other branches 4 would not be affected. Therefore, the array substrate can be further manufactured as usual.

Figure 6:
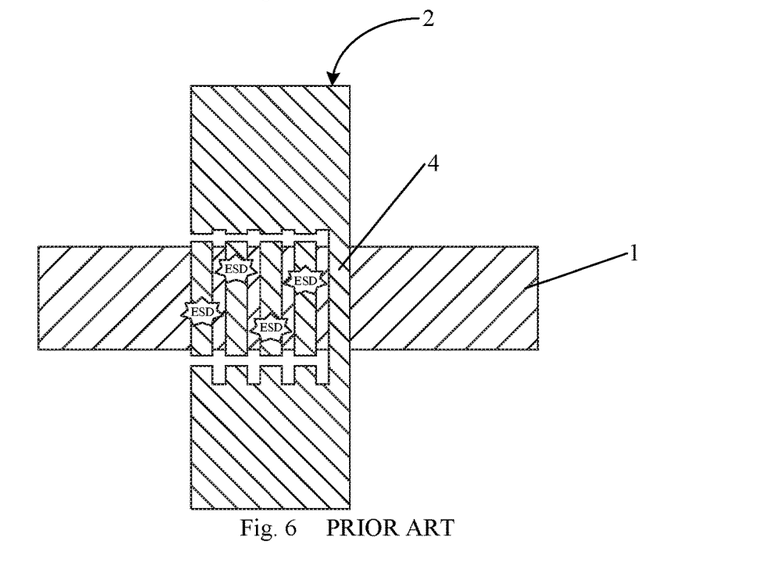
FIG. 6 schematically shows the repaired wirings after ESD occurs to several of the branches as shown in FIG. 3.

It is discovered that, the probability of occurrence of the ESD phenomenon of a branch 4 is the same as that of each of other branches 4 at the same place during manufacturing of the array substrate. That is, the ESD phenomenon may occur to any of the branches 4, or even to several branches 4 at the same time. It is obvious that, as shown in FIG. 6, if the number of branches 4 to which the ESD phenomenon occurs is relatively large, and the two ends of the branches 4 to which the ESD phenomenon occurs are cut off, the number of residual branches 4 which are still available is relatively small. In this case, the resistance of the second wiring 2 would become over high, and the follow-up manufacturing procedure of the array substrate would be affected. Under such circumstances, the array substrate cannot be further manufactured, and thus the qualified rate and manufacturing cost of the array substrate cannot be guaranteed effectively.

SUMMARY OF THE INVENTION

The purpose of the present disclosure is to provide an array substrate and a manufacturing method thereof, whereby the qualified rate of the array substrate can be improved, and the manufacturing cost thereof can be reduced significantly.

The present disclosure provides an array substrate, comprising a first wiring, a first insulating layer, and a second wiring from bottom up in sequence, wherein said second wiring crosses over said first wiring; wherein a crossed-over part of said second wiring consists of a plurality of branches, with an interspace formed between every two adjacent branches, so as to obtain a comb structure; and wherein at least one of the branches is nearer to said first wiring relative to other branches.

The first insulating layer has a smaller thickness at a region below at least one of the branches than the respective regions below other branches.

A semiconductor structure is provided between said first insulating layer and some of said branches, so that at least one of the branches is nearer to said first wiring relative to other branches.

Said array substrate further comprises a second insulating layer arranged between said first insulating layer and said second wiring, wherein said second insulating layer is hollowed out partially, with a hollowed-out area corresponding to at least one of the branches of the second wiring, so that said at least one of the branches is nearer to said first wiring relative to other branches.

A semiconductor structure is provided below each branch of said second wiring.

Said semiconductor structure and each branch of said second wiring are formed through one patterning procedure.

According to the present disclosure, the following beneficial effects can be brought about. The technical solution of the embodiments of the present disclosure provides an array substrate, wherein the second wiring of the array substrate crosses over the first wiring thereof, and the crossed-over part of the second wiring is separated into a plurality of branches, at least one of the branches is nearer to the first wiring relative to other branches. When the charges of the first wiring and the second wiring accumulate to a certain extent, the ESD phenomenon would occur only to the branch which is nearer to the first wiring. Since the ESD phenomenon occurs to a relatively fixed place, the troubleshooting time of the worker can be reduced, so that the second wiring can be repaired more easily, and thus the manufacturing efficiency of the array substrate can be improved. At the same time, it can be guaranteed that the resistance of the second wiring after repair is not over high. In this case, the array substrate can be further manufactured, the qualified rate of the array substrate can be improved, and the manufacturing cost thereof can be reduced.

According to another aspect, the present disclosure further provides a method for manufacturing an array substrate, comprising the steps of:
forming a first wiring;
forming a first insulating layer on said first wiring;
forming an uneven surface; and
forming a second wiring on said uneven surface, said second wiring crossing over said first wiring;
wherein a crossed-over part of said second wiring consists of a plurality of branches, with an interspace formed between every two adjacent branches, so as to obtain a comb structure; and
wherein said uneven surface enables at least one of the branches to be nearer to said first wiring relative to other branches.

Said forming an uneven surface comprises:
etching a surface of said first insulation layer to form a groove; and
said forming a second wiring on said uneven surface comprises:
forming a second wiring with some of branches of said second wiring being located in said groove, so that at least one of the branches is nearer to said first wiring relative to other branches.

Said forming an uneven surface comprises:
forming a second insulating layer on said first insulating layer; and
etching a surface of said second insulating layer, so that said second insulating layer is hollowed out partially to form the uneven surface; and
said forming a second wiring on said uneven surface comprises:
forming a second wiring with some of branches of said second wiring being located in a hollowed-out area of said second insulating layer, so that at least one of the branches is nearer to said first wiring relative to other branches.

Said forming an uneven surface comprises:
forming a semiconductor structure on a surface of said first insulating layer, so as to form the uneven surface; and
said forming a second wiring on said uneven surface comprises:
forming a second wiring with some of branches of said second wiring being located on said semiconductor structure, so that at least one of the branches is nearer to said first wiring relative to other branches.

Said forming an uneven surface comprises:
forming a second insulating layer on said first insulating layer;
patterning said second insulating layer, so that said second insulating layer is partially hollowed out; and
forming a semiconductor structure on said second insulating layer, said semiconductor structure being located beside a hollowed-out area, so that the uneven surface can be formed; and
said forming a second wiring on said uneven surface comprises:
forming a second wiring with some of branches of said second wiring being located in said hollowed-out area and other branches being located on said semiconductor structure, so that at least one of the branches is nearer to said first wiring relative to other branches.

Said forming an uneven surface comprises:
etching a surface of said first insulating layer to form a groove; and
forming a semiconductor layer on said first insulating layer, a surface of said semiconductor layer being uneven due to the groove; and
said forming a second wiring on said uneven surface comprises:
forming a metal layer on said semiconductor layer with an uneven surface; and
etching said semiconductor layer and said metal layer in one patterning procedure, so as to form a pattern of said semiconductor structure and a pattern of said second wiring, with some of branches of said second wiring being located on a region of said semiconductor structure corresponding to said groove, so that at least one of the branches is nearer to said first wiring relative to other branches.

Said forming an uneven surface comprises:
etching a surface of said first insulating layer to form a groove; and
forming a semiconductor layer on said first insulating layer and patterning said semiconductor layer to form a semiconductor structure, said semiconductor structure being located beside said groove to form an uneven surface; and
said forming a second wiring on said uneven surface comprises:
forming a second wiring with some of branches of said second wiring being located in said groove and other branches being located on said semiconductor structure, so that at least one of the branches is nearer to said first wiring relative to other branches.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The drawings necessary for explaining the embodiments will be introduced briefly below to illustrate the technical solutions of the embodiments of the present disclosure more clearly. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Embodiment 1

Figure 7:
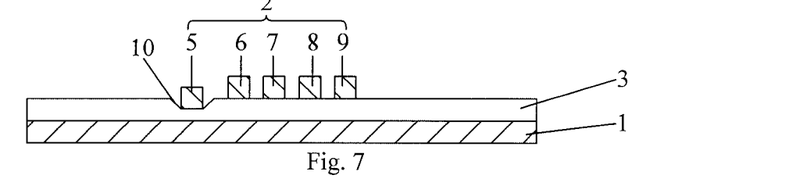
FIGS. 7 to 13 schematically show a structure of an array substrate provided by embodiment 1 and embodiment 2 of the present disclosure.

The present embodiment provides an array substrate, as shown in FIG. 7, said array substrate comprises a first wiring 1, a first insulating layer 3, and a second wiring 2 from bottom up in sequence, wherein the second wiring 2 crosses over the first wiring 1. A crossed-over part of the second wiring 2 consists of a plurality of branches 4, with an interspace formed between every two adjacent branches 4, so as to form a comb structure. At least one of the branches 4 is nearer to the first wiring 1 relative to other branches 4.

Since all the branches 4 of the second wiring 2 are connected with one another, an electric potential of one branch 4 is the same as that of other branches 4, and thus an electric potential difference between one branch 4 and the first wiring 1 is the same as that between other branches 4 and the first wiring 1. According to the formula of electric field strength, i.e., $E=U/D$, wherein E is the electric field strength, U is the electric potential difference, and D is the distance between the first wiring 1 and the second wiring 2, it can be seen that, the smaller the distance D is, the larger the electric field strength E would be, and the larger the probability of occurrence of ESD would become. Therefore, according to the embodiment of the present disclosure, the locations of the branches 4 of the second wiring 2 is arranged so that at least one of the branches 4 is nearer to the first wiring 1 relative to other branches 4. In this case, the ESD phenomenon would only occur to the branch 4 which is nearer to the first wiring 1. During the manufacturing of array substrate, a certain number of charges would accumulate in the wirings. When the charges accumulate to a certain extent, the ESD phenomenon would occur to the branch 4 which is nearer to the first wiring 1. When the ESD phenomenon occurs, the charges accumulated in the first wiring 1 and the second wiring 2 would release, that is, the charges existing in the first wiring 1 and the second wiring 2 would reduce. It is demonstrated in practice that, in following steps, the probability that a large number of charges accumulate once again in the first wiring 1 and the second wiring 2 to the extent that the ESD phenomenon occurs is small. In addition, since the probability that the ESD phenomenon occurs once again is small, and the branch 4 to which the ESD phenomenon occurs can be adjusted and controlled, there are still many branches 4 that are in good connection after ESD occurs, and the resistance of these branches 4 can be controlled. Therefore, the location and number of the branches 4 to which ESD occurs can be arranged in a reasonable manner, so that the resistance of the second wiring 2 would not be too high, and the array substrate can be further manufactured.

In order to reduce the resistance of the second wiring 2 after ESD occurs as much as possible, preferably, only one branch 4 is arranged to be nearer to the first wiring 1. For example, as shown in FIG. 7, the crossed-over part of the second wiring 2 consists of five branches 4. For convenience, the branches are defined as the first branch 5 to the fifth branch 9 from left to right in sequence, wherein the distance between the first wiring 1 and the first branch 5 is the smallest, while the distances between the first wiring 1 and the second branch 6 to the fifth branch 9 respectively are larger. According to the analysis hereinabove, it can be understood that, if ESD occurs, it would occurs to the first branch 5. In this case, the second branch 6 to the fifth branch 9 are all in good connection, and thus the resistance of the second wiring 2 would not increase to a large extent.

It is obvious that, the crossed-over part of the second wiring 2 can be separated into any number of branches 4 according to actual situation. For example, the crossed-over part of the second wiring 2 can be separated into six branches 4, seven branches 4, or even more, and the number of branches 4 is not restricted by the embodiment of the present disclosure.

Moreover, since the ESD phenomenon occurs to a relatively fixed place, it is easy to repair the second wiring 2 to which ESD occurs through cutting off the branch 4. The troubleshooting time of the worker can be reduced, and thus the manufacturing efficiency of the array substrate can be improved.

The technical solution of the embodiment of the present disclosure provides an array substrate, wherein the second wiring of the array substrate crosses over the first wiring thereof, and the crossed-over part of the second wiring is separated into a plurality of branches, at least one of the branches being nearer to the first wiring relative to other branches. When the charges of the first wiring and the second wiring accumulate to a certain extent, the ESD phenomenon would occur only to the branch which is nearer to the first wiring. Since the ESD phenomenon occurs to a relatively fixed place, the troubleshooting time of the worker can be reduced, the second wiring can be repaired more easily, and thus the manufacturing efficiency of the array substrate can be improved. At the same time, it can be guaranteed that the resistance of the second wiring after repair is not over high. In this case, the array substrate can be further manufactured, the qualified rate of the array substrate can be improved, and the manufacturing cost thereof can be reduced.

Specifically, at least one of the branches 4 nearer to the first wiring 1 relative to other branches 4 can be realized through the following methods.

For example, at least one of the branches 4 being nearer to the first wiring 1 relative to other branches 4 can be realized through lowering the first branch 5. In particular, the first insulating layer 3 can be arranged to have a smaller thickness at a region below at least one of the branches 4 than the respective regions below other branches 4, whereby at least one of the branches 4 being nearer to the first wiring 1 relative to other branches 4 can be realized. Specifically, as shown in FIG. 7, the first insulating layer 3 is etched partially at a region thereof which is located between the first wiring 1 and the second wiring 2 before the second wiring 2 is prepared, so that a groove 10 is formed. The groove 10 enables the first insulating layer 3 to have a smaller thickness at a region below the first branch 5 of the second wiring 2 than the respective regions below the second branch 6 to the fifth branch 9 thereof, so that the first branch 5 is lowered. Thus at least one of the branches 4 nearer to the first wiring 1 relative to other branches 4 can be realized.

Figure 8:
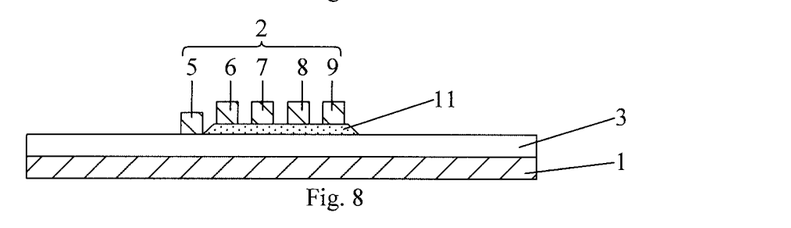

For another example, at least one of the branches 4 being nearer to the first wiring 1 relative to other branches 4 can be realized through maintaining said at least one of the branches 4 on the original height, while uplifting other branches 4. As shown in FIG. 8, a semiconductor structure 11 is provided between the first insulating layer 3 and some of branches 4, so that at least one of the branches 4 is nearer to the first wiring 1 relative to other branches 4. Specifically, the semiconductor structure 11 with an island shape is provided on the first insulating layer 3 before the second wiring 2 is prepared. When the second wiring 2 is prepared, the second branch 6 to the fifth branch 9 of the second wiring 2 are provided on the semiconductor structure 11, while the first branch 5 thereof is still provided on the first insulating layer 3. Since the semiconductor structure 11 is provided below the second branch 6 to the fifth branch 9, the second branch 6 to the fifth branch 9 are uplifted, while the location of the first branch 5 does not change compared with that in the prior art, so that the first branch 5 is nearer to the first wiring 1 relative to the second branch 6 to the fifth branch 9. In this manner, at least one of the branches 4 being nearer to the first wiring 1 relative to other branches 4 can be realized.

Figure 9:
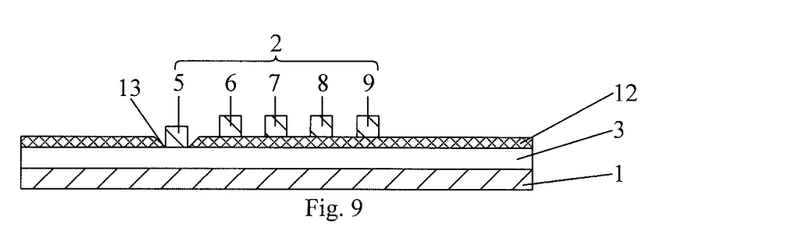

In addition, maintaining at least one of the branches 4 on the original height, while uplifting other branches 4 can be realized through the following structures. The array substrate further comprises a second insulating layer 12 that is arranged between the first insulating layer 3 and the second wiring 2. The second insulating layer 12 is hollowed out partially, and a hollowed-out area 13 corresponds to at least one of the branches 4 of the second wiring 2, so that at least one of the branches 4 is nearer to the first wiring 1 relative to other branches 4. Specifically, as shown in FIG. 9, the second insulating layer 12 is formed on the first insulating layer 3 through depositing or other methods before the second wiring 2 is prepared. To facilitate the etching, the second insulating layer 12 can be made of a material different from the first insulating layer 3. For example, the material of the first insulating layer 3 may be silicon nitride (SiNx), and the material of the second insulating layer 12 may be silicon oxide (SiOx). The second insulating layer 12 is patterned, so that the hollowed-out area 13 is formed partially. The location and width of the hollowed-out area 13 should correspond to at least one of the branches 4 of the second wiring 2 which is to be formed soon, for example, correspond to the first branch 5 of the second wiring 2. In this manner, after the second wiring 2 is formed, the first branch 5 thereof is located in the hollowed-out area 13 of the second insulating layer 12, while the second branch 6 to the fifth branch 9 thereof are located on the second insulating layer 12. Therefore, the second branch 6 to the fifth branch 9 are uplifted, while the location of the first branch 5 does not change compared with that in the prior art, so that the first branch 5 is nearer to the first wiring 1 relative to the second branch 6 to the fifth branch 9. In this manner, at least one of the branches 4 being nearer to the first wiring 1 relative to other branches 4 can be realized.

Figures 10, 11:
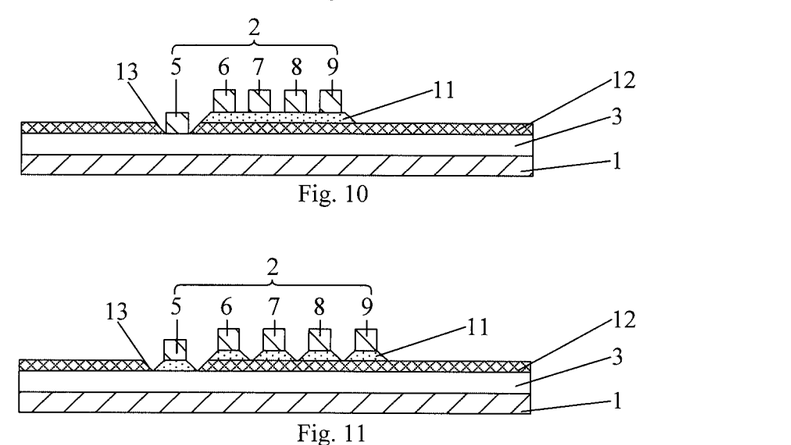

Alternatively, as shown in FIG. 10, based on the structure as shown in FIG. 9, a semiconductor structure 11 with an island shape is further provided between the second insulating layer 12 and the second branch 6 to the fifth branch 9 of the second wiring 2. It is obvious that, the second branch 6 to the fifth branch 9 are further uplifted by the semiconductor structure 11, while the location of the first branch 5 does not change compared with that in the prior art, so that the first branch 5 is nearer to the first wiring 1 relative to the second branch 6 to the fifth branch 9. In this manner, at least one of the branches 4 being nearer to the first wiring 1 relative to other branches 4 can be realized.

For another example, all branches 4 of the second wiring 2 can be uplifted, wherein an uplifting amount of at least one of the branches 4 is less than those of other branches 4. As shown in FIG. 11 and similar to FIG. 10, the second insulating layer 12 is formed on the first insulating layer 3 through depositing or other methods before the second wiring 2 is prepared. The second insulating layer 12 is patterned, so that the hollowed-out area 13 is formed partially. The location and width of the hollowed-out area 13 should correspond to at least one of the branches 4 of the second wiring 2 which is to be formed soon, for example, correspond to the first branch 5 of the second wiring 2. Then, the semiconductor structure 11 corresponding to the crossed-over part of the second wiring 2 is formed, and the branches 4 are formed on the semiconductor structure 11. Since the location of the hollowed-out area 13 corresponds to the first branch 5, the semiconductor structure 11 below the first branch 5 is located in the hollowed-out area 13. In this case, the height of the surface of the semiconductor structure 11 below the first branch 5 is lower than those of other semiconductor structures 11 below other branches. That is, the uplifting amount of the first branch 5 is less than those of the second branch 6 to the fifth branch 9. Therefore, the first branch 5 is nearer to the first wiring 1 relative to the second branch 6 to the fifth branch 9, and at least one of the branches 4 being nearer to the first wiring 1 relative to other branches 4 can be realized.

In the structure as shown in FIG. 11, since the semiconductor structure 11 has a comb shape, which is similar to that of the branches 4 of the second wiring 2, the semiconductor structure 11 and the branches 4 of the second wiring 2 can be formed in one patterning procedure. That is, the branches 4 of the second wiring 2 and the semiconductor structure 11 are formed at the same time, so that one patterning procedure can be saved, and the manufacturing difficulty of the structure as shown in FIG. 11 can be reduced.

Figure 12:
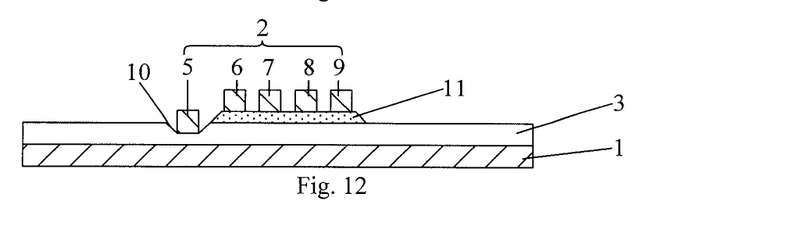

For another example, at least one of the branches 4 can be lowered, and other branches 4 can be uplifted at the same time. The first insulating layer 3 can be arranged to have a smaller thickness at a region below at least one of the branches 4 than at the respective regions below other branches 4, and at the same time, a semiconductor structure 11 is provided between other branches 4 and the first insulating layer 3. As shown in FIG. 12, based on the structure as shown in FIG. 7, the semiconductor structure 11 with an island shape is provided between the second branch 6 to the fifth branch 9 and the first insulating layer 3. The second branch 6 to the fifth branch 9 can be uplifted by the island-shaped semiconductor structure 11, so that the distance between the second branch 6 to the fifth branch 9 and the first wiring 1 can be increased. In this manner, the second branch 6 to the fifth branch 9 are farther from the first wiring 1 relative to the first branch 5, and thus at least one of the branches 4 being nearer to the first wiring 1 relative to other branches 4 can be realized.

It should be noted that, in the structure as shown in FIGS. 8, 10, and 12, the semiconductor structure 11 is provided on the crossed-over part of the first wiring 1 and the second wiring 2. Although the semiconductor structure 11 would be excited and turned on theoretically when the first wiring 1 carries electric signals, it is demonstrated by experiments that, however, the free electrons of the semiconductor structure 11 would only gather on the surface thereof, and the semiconductor structure 11 would not become a conductor. Therefore, the heights of the branches 4 of the second wiring 2 can be changed by the semiconductor structure 11. In this manner, at least one of the branches 4 being nearer to the first wiring 1 relative to other branches 4 can be realized.

In general, the first wiring 1 is arranged in the same layer as the gate lines of the array substrate; the first insulating layer 3 is arranged in the same layer as the gate insulating layer of the Thin Film Transistor of the array substrate, and the thickness thereof ranges from 0.3 mm to 0.5 mm in general; and the second wiring 2 is arranged in the same layer as the data lines of the array substrate. According to the embodiment of the present disclosure, the semiconductor structure 11 is arranged in the same layer as an active layer of the Thin Film Transistor of the array substrate, and a thickness thereof ranges from 0.1 mm to 0.2 mm; and a thickness of the second insulating layer 12 ranges from 0.2 mm to 0.3 mm.

Further, in combination with the foregoing, it can be understood that, in the embodiment of the present disclosure, the etching depth of the first insulating layer 3 as shown in FIG. 7 should be set reasonably, for example, 0.1 mm. Otherwise, the short circuit phenomenon would occur between the second wiring 2 and the first wiring 1. In this case, the distance between the first branch 5 of the second wiring 2 and the first wiring 1 ranges from 0.2 mm to 0.4 mm. Since the first insulating layer 3 is provided between the second branch 6 to the fifth branch 9 and the first wiring 1, the distance between the second branch 6 to the fifth branch 9 and the first wiring 1 ranges from 0.3 mm to 0.5 mm. Similarly, the etching depth of the first insulating layer 3 as shown in FIG. 12 should be set reasonably, for example, 0.1 mm. In this case, the distance between the first branch 5 and the first wiring 1 ranges from 0.2 mm to 0.4 mm. Since the first insulating layer 3 and the semiconductor structure 11 are provided between the second branch 6 to the fifth branch 9 and the first wiring 1, the distance between the second branch 6 to the fifth branch 9 and the first wiring 1 ranges from 0.4 mm to 0.7 mm.

In addition, in combination with the foregoing, it can be understood that, in the structure as shown in FIG. 8, only the first insulating layer 3 is provided between the first branch 5 and the first wiring 1, thus the distance between the first branch 5 and the first wiring 1 ranges from 0.3 mm to 0.5 mm. The first insulating layer 3 and the semiconductor structure 11 are provided between the second branch 6 to the fifth branch 9 and the first wiring 1, thus the distance between the second branch 6 to the fifth branch 9 and the first wiring 1 ranges from 0.4 mm to 0.7 mm. In the structure as shown in FIG. 9, only the first insulating layer 3 is provided between the first branch 5 and the first wiring 1 as well, thus the distance between the first branch 5 and the first wiring 1 ranges from 0.3 mm to 0.5 mm. The first insulating layer 3 and the second insulating layer 12 are provided between the second branch 6 to the fifth branch 9 and the first wiring 1, thus the distance between the second branch 6 to the fifth branch 9 and the first wiring 1 ranges from 0.5 mm to 0.8 mm. In the structure as shown in FIG. 10, only the first insulating layer 3 is provided between the first branch 5 and the first wiring 1 as well, thus the distance between the first branch 5 and the first wiring 1 ranges from 0.3 mm to 0.5 mm. The first insulating layer 3, the second insulating layer 12, and the semiconductor structure 11 are provided between the second branch 6 to the fifth branch 9 and the first wiring 1, thus the distance between the second branch 6 to the fifth branch 9 and the first wiring 1 ranges from 0.6 mm to 1 mm. In the structure as shown in FIG. 11, the first insulating layer 3 and the semiconductor structure 11 are provided between the first branch 5 and the first wiring 1, thus the distance between the first branch 5 and the first wiring 1 ranges from 0.4 mm to 0.7 mm. The first insulating layer 3, the second insulating layer 12, and the semiconductor structure 11 are provided between the second branch 6 to the fifth branch 9 and the first wiring 1, thus the distance between the second branch 6 to the fifth branch 9 and the first wiring 1 ranges from 0.6 mm to 1 mm.

Figure 13:
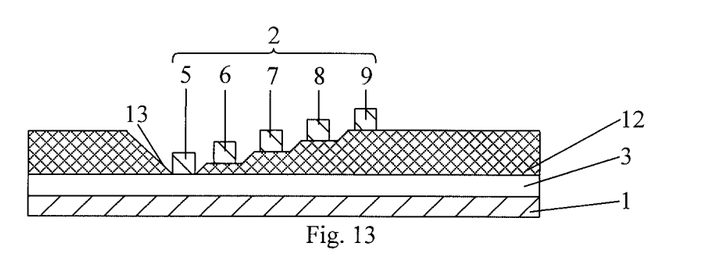

Moreover, according to the embodiment of the present disclosure, the second insulating layer 12 can be etched several times by a gray-scale photomask on the basis of the structure as shown in FIG. 9, so that the second insulating layer 12 with a step shape surface as shown in FIG. 13 can be formed. In this manner, a certain height difference among the branches 4, which are located on the second insulating layer 12, can be formed. According to the formula of electric field strength as above mentioned, i.e., E=U/D, it can be understood that, the probability of occurrence of the ESD phenomenon of some branches 4 (for example, the fourth branch 8 and the fifth branch 9 as shown in FIG. 13) can be further reduced, and thus the follow-up manufacturing procedures of the array substrate can be performed.

It should be noted that, the structures of the first wiring 1 and the second wiring 2 according to the embodiment of the present disclosure are applicable for any crossed-over part of the wirings of the array substrate. Moreover, as long as there is no structural conflict, any of the technical solutions as shown in FIGS. 7 to 13 provided by the embodiments of the present disclosure can be combined or modified, and the new technical solutions obtained in this manner all fall within the scope of the present disclosure.

Embodiment 2

The present embodiment further provides a method for manufacturing an array substrate, and said method comprises the following steps.

In step S101, a first wiring is formed.

In step S102, a first insulating layer is formed on said first wiring.

In step S103, an uneven surface is formed.

In step S104, a second wiring is formed on said uneven surface, said second wiring crossing over said first wiring; wherein a crossed-over part of said second wiring consists of a plurality of branches, with an interspace formed between every two adjacent branches, so as to obtain a comb structure; and wherein said uneven surface is configured so that at least one of the branches is nearer to said first wiring relative to other branches.

It can be seen that, step S103, i.e., how to form an uneven surface, is important to enable at least one of the branches to be nearer to said first wiring relative to other branches. According to the embodiment of the present disclosure, step S103 can be realized through the following methods.

For example, step S103 can include etching a surface of the first insulating layer to form a groove therein.

Figure 14:
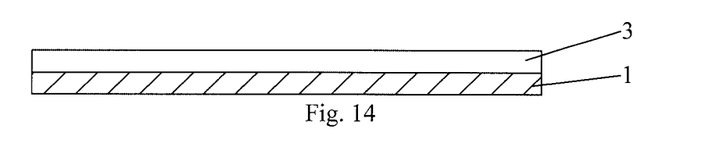
FIGS. 14 to 24 schematically show the structure of the array substrate provided by embodiment 2 of the present disclosure.
Figure 15:
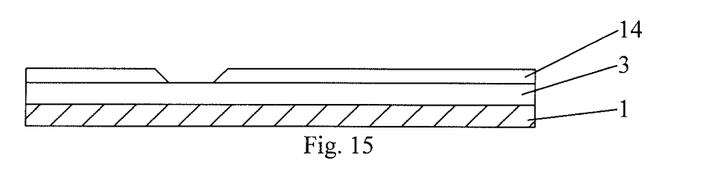
Figure 17:
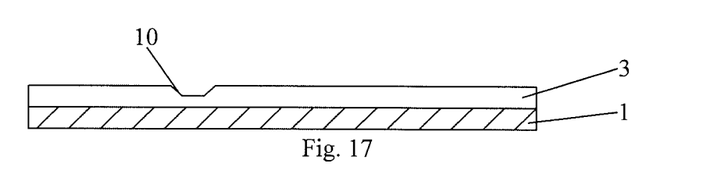

Specifically, the structure of the array substrate after step S102 is performed is schematically shown in FIG. 14. Based on the structure as shown in FIG. 14, a photoresist layer 14 is coated, exposed, and etched, so that a structure as shown in FIG. 15 is formed. Then, the structure as shown in FIG. 15 is etched, wherein the etching time and the concentration of the etchant used therein are both controlled, so that at least one groove 10 with a depth of 0.1 mm more or less can be formed on the surface of the first insulating layer 3, which is shown in FIG. 17.

In this case, in step S104, a second wiring is formed, with some of branches of said second wiring being located in said groove, so that at least one of the branches is nearer to said first wiring relative to other branches.

As shown in FIG. 7, since some of the branches 4 of the second wiring 2 are located in the groove 10, it is obvious that, the branches 4 that are not located in the groove 10 are farther from the first wiring 1 below the first insulating layer 3 than the branches 4 that are located in the groove 10. In this manner, at least one of the branches 4 being nearer to the first wiring 1 relative to other branches 4 can be realized.

It should be noted that, the width of the groove 10 should be determined according to the number and width of the branches 4 accommodated therein. As shown in FIG. 7, only one branch 4 is accommodated in the groove 10 here. If the width of the branch 4 is 50 μm more or less, the width of the groove 10 can be determined as 60 μm more or less. It is obvious that the width of the groove 10 should be slightly larger than the width of the branch 4 accommodated therein.

For another example, in step S103, a semiconductor structure can be formed on the surface of the first insulating layer.

Figure 16:
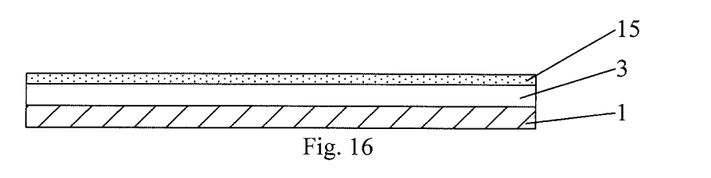

As shown in FIG. 16, based on the structure as shown in FIG. 14, a semiconductor layer 15 can be formed. Then, the semiconductor layer 15 is patterned so as to form a semiconductor structure 11 with an island shape, which is shown in FIG. 18.

In this case, in step S104, a second wiring is formed, with some of branches of said second wiring being located on said semiconductor structure, so that at least one of the branches is nearer to said first wiring relative to other branches.

Figure 18:
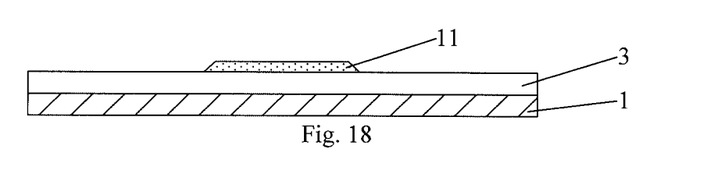

As shown in FIG. 8, based on the structure as shown in FIG. 18, a second wiring 2 is further formed, wherein at least one of the branches 4 of the second wiring 2 is directly arranged on the first insulating layer 3, and other branches 4 are arranged on the semiconductor structure 11. It is obvious that, the branch 4 that is not arranged on the semiconductor structure 11 is nearer to the first wiring 1 relative to other branches 4.

For another example, the step S103 may comprise sub-steps S201 and S202.

In sub-step S201, a second insulating layer is formed on the first insulating layer.

Figure 19:
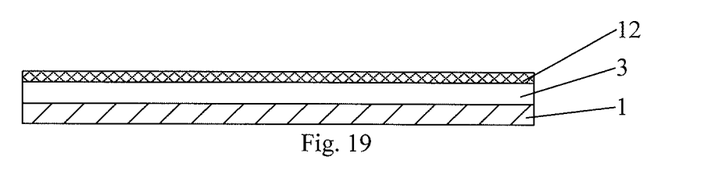

As shown in FIG. 19, based on the structure as shown in FIG. 14, a second insulating layer 12 is further formed.

In sub-step S202, the second insulating layer is patterned, so that the second insulating layer is hollowed out partially, and thus an uneven surface is formed.

Figure 20:
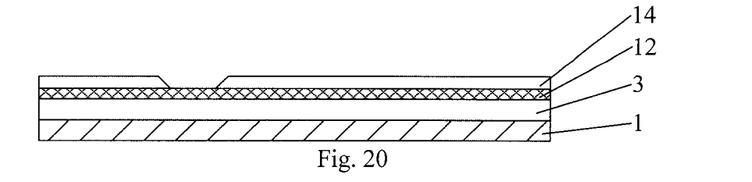
Figure 21:
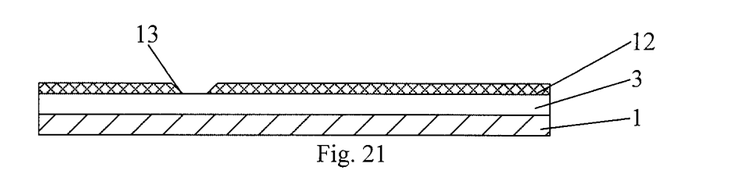

The second insulating layer 12 as shown in FIG. 19 is patterned, i.e., a photoresist layer 14 is coated and then exposed, so as to form the structure as shown in FIG. 20. Then, the structure as shown in FIG. 20 is etched, until the corresponding part of the second insulating layer 12 is hollowed out. The location and width of the hollowed-out area 13 corresponds to those of at least one of the branches 4 of the second wiring 2 to be formed therein, which is shown in FIG. 21.

It should be noted that, according to the embodiment of the present disclosure, the second insulating layer 12 can be preferably made of photoresist. In this manner, one patterning procedure can be saved, and thus the manufacturing cost of the array substrate can be reduced.

Accordingly, in step S104, a second wiring is formed, with some of branches of said second wiring being located in a hollowed-out area of said second insulating layer, so that at least one of the branches is nearer to said first wiring relative to other branches.

As shown in FIG. 9 and similar to FIG. 7, after the second wiring 2 is formed, at least one of the branches 4 is located in the hollowed-out area 13 of the second insulating layer 12, without being supported by the second insulating layer 12. In this case, at least one of the branches 4 being nearer to the first wiring 1 relative to other branches 4 can be realized.

Similarly, the width of the hollowed-out area 13 should be determined according to the number and width of the branches 4 accommodated therein. As shown in FIG. 9, only one branch 4 is accommodated in the hollowed-out area 13 here. If the width of the branch 4 is 50 μm, the width of the groove 10 can be determined as 60 μm. That is, the width of the hollowed-out area 13 should be slightly larger than the width of the branch 4 accommodated therein.

Moreover, in sub-step S202, in addition to the formed hollowed-out area 13, the second insulating layer 12 can be patterned for several times by a gray-scale photomask, so that the second insulating layer 12 with a stepped surface can be formed. As shown in FIG. 13, after the second wiring 2 is formed, the second insulating layer 12 with a stepped surface would enable the heights of the branches to be different from one another. In this manner, the heights of the branches 4 can be further regulated, and thus the distances between each branch 4 and the first wiring 1 can be regulated.

In addition, based on sub-step S202, step S103 may further comprise sub-step S203.

In sub-step S203, a semiconductor structure is formed on said second insulating layer, said semiconductor structure being located beside said hollowed-out area, so that the uneven surface can be formed.

It is obvious that, as shown in FIG. 10, in addition to the branch that is located in the hollowed-out area 13, other branches 4 are all supported by the semiconductor structure 11. Compared with the structure as shown in FIG. 9, these branches 4 are farther from the first wiring 1. In this case, at least one of the branches 4 being nearer to the first wiring 1 relative to other branches 4 can be realized.

Specifically, the method to form the semiconductor structure 11 is the same as the method as above mentioned, and the details of which are no longer repeated here.

Accordingly, in step S104, a second wiring is formed, with some of branches of said second wiring being located in said hollowed-out area and other branches being located on said semiconductor structure, so that at least one of the branches is nearer to said first wiring relative to other branches.

Thus, the structure as shown in FIG. 12 is formed.

Moreover, step S103 may comprise sub-steps S301 and S302.

In sub-step S301, a surface of the first insulating layer is etched to form a groove.

Specifically, the structure as shown in FIG. 17 is formed.

In sub-step S302, a semiconductor layer is formed on the first insulating layer, a surface of the semiconductor layer being uneven due to the groove thereof.

Figure 22:
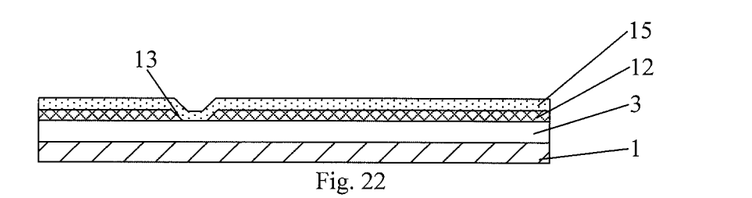

It is obvious that, as shown in FIG. 22, the semiconductor layer 15, which is deposited on the array substrate in a uniform manner, comprises a depression due to the groove 10, which renders the surface of the array substrate being uneven.

Then, the step S104 specifically comprises sub-steps S303 and S304.

In sub-step S303, a metal layer is formed on the semiconductor layer with an uneven surface.

Figure 23:
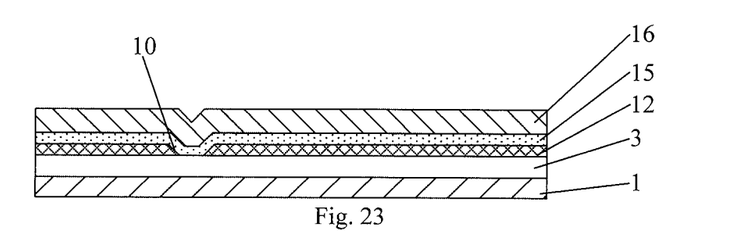

Specifically, as shown in FIG. 23, a metal layer 16 is formed on the semiconductor layer 15 with an uneven surface through sputtering or other methods, wherein the depression of the semiconductor layer 15 makes that the metal layer 16 has a depression on its surface as well.

In sub-step S304, the semiconductor layer and the metal layer are etched in one patterning procedure, so as to form a pattern of the semiconductor structure and a pattern of the second wiring, with some of branches of the second wiring being located on a region of the semiconductor structure corresponding to the groove, so that at least one of the branches is nearer to the first wiring relative to other branches.

After the structure as shown in FIG. 23 is patterned, the structure as shown in FIG. 11 can be obtained. Since the second wiring 2 and the semiconductor structure 11 are formed through one procedure, and the second wiring 2 should be formed as having a plurality of branches 4 with no contact therebetween, the semiconductor structure 11 can be deemed as a comb structure as well.

Figure 24:
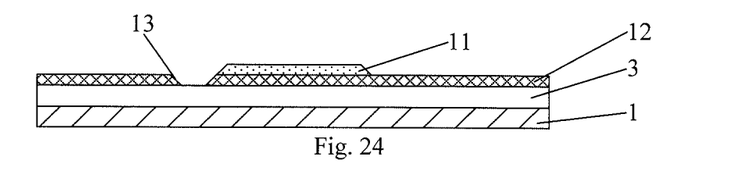

It is obvious that, based on sub-step S302, the semiconductor layer 15 can be first patterned, so that the semiconductor structure 11 with an island shape can be formed, which is shown in FIG. 24. In this manner, the semiconductor structure is located beside the groove 10 to form an uneven surface.

Accordingly, in step S104, a second wiring is formed, with some of branches of said second wiring being located in said groove and other branches being located on said semiconductor structure, so that at least one of the branches is nearer to said first wiring relative to other branches. That is, the structure as shown in FIG. 12 is formed.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

LIST OF REFERENCE SIGNS

1—first wiring
2—second wiring
3—first insulating layer
4—branches
5—first branch
6—second branch
7—third branch
8—fourth branch
9—fifth branch
10—groove
11—semiconductor structure
12—second insulating layer
13—hollowed-out area
14—photoresist layer
15—semiconductor layer
16—metal layer

The invention claimed is:

1. An array substrate, comprising a first wiring, a first insulating layer, and a second wiring from bottom up in sequence,
   wherein said second wiring crosses over said first wiring;
   wherein a crossed-over part of said second wiring consists of a plurality of branches, with an interspace formed between every two adjacent branches, so as to obtain a comb structure;
   wherein at least one of the branches is nearer to said first wiring relative to other branches; and
   wherein the first insulating layer has a smaller thickness at a region below at least one of the branches than the respective regions below other branches.

2. The array substrate according to claim 1, wherein a semiconductor structure is provided between said first insulating layer and some of said branches, so that at least one of the branches is nearer to said first wiring relative to other branches.

3. The array substrate according to claim 1, further comprising a second insulating layer arranged between said first insulating layer and said second wiring, wherein said second insulating layer is hollowed out partially, with a hollowed-out area corresponding to at least one of the branches of the second wiring, so that said at least one of the branches is nearer to said first wiring relative to other branches.

4. The array substrate according to claim 3, wherein a semiconductor structure is provided below each branch of said second wiring.

5. The array substrate according to claim 4, wherein said semiconductor structure and each branch of said second wiring are formed through one patterning procedure.

6. A method for manufacturing an array substrate, comprising the steps of:
   forming a first wiring;
   forming a first insulating layer on said first wiring;
   forming an uneven surface; and
   forming a second wiring on said uneven surface, said second wiring crossing over said first wiring;
   wherein a crossed-over part of said second wiring consists of a plurality of branches, with an interspace formed between every two adjacent branches, so as to obtain a comb structure;
   wherein said uneven surface enables at least one of the branches to be nearer to said first wiring relative to other branches; and
   wherein said forming an uneven surface comprises:
      etching a surface of said first insulation layer to form a groove; and
   wherein said forming a second wiring on said uneven surface comprises:
      forming a second wiring with some of branches of said second wiring being located in said groove, so that at least one of the branches is nearer to said first wiring relative to other branches.

7. A method for manufacturing an array substrate, comprising the steps of:
   forming a first wiring;
   forming a first insulating layer on said first wiring;
   forming an uneven surface; and
   forming a second wiring on said uneven surface, said second wiring crossing over said first wiring;
   wherein a crossed-over part of said second wiring consists of a plurality of branches, with an interspace formed between every two adjacent branches, so as to obtain a comb structure;
   wherein said uneven surface enables at least one of the branches to be nearer to said first wiring relative to other branches;
   wherein said forming an uneven surface comprises:
      forming a second insulating layer on said first insulating layer; and
      etching a surface of said second insulating layer, so that said second insulating layer is hollowed out partially to form the uneven surface; and
   wherein said forming a second wiring on said uneven surface comprises:
      forming a second wiring with some of branches of said second wiring being located in a hollowed-out area of said second insulating layer, so that at least one of the branches is nearer to said first wiring relative to other branches.

* * * * *